United States Patent
Yang et al.

(10) Patent No.: US 7,863,621 B2
(45) Date of Patent: Jan. 4, 2011

(54) THIN FILM TRANSISTOR

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 22 days.

(21) Appl. No.: 11/515,903

(22) Filed: Sep. 6, 2006

(65) Prior Publication Data

US 2007/0082433 A1    Apr. 12, 2007

(30) Foreign Application Priority Data

Sep. 7, 2005    (KR) ...................... 10-2005-0083326

(51) Int. Cl.
  *H01L 27/14* (2006.01)
  *H01L 29/04* (2006.01)
  *H01L 29/15* (2006.01)
  *H01L 31/036* (2006.01)

(52) U.S. Cl. .............................. 257/72; 257/57; 257/59; 257/66; 257/69; 257/347; 257/350; 257/354; 257/E39.02; 257/E29.006; 257/E29.242; 438/166; 438/486; 438/489; 438/479; 438/482; 438/660; 438/684

(58) Field of Classification Search .................... 257/57, 257/59, 66, 72, 347, 350, 354, 69, 39.02, 257/E29.006, E29.242; 438/166, 486, 487
See application file for complete search history.

(56) References Cited

U.S. PATENT DOCUMENTS

| | | | |
|---|---|---|---|
| 5,643,826 A * | 7/1997 | Ohtani et al. | ................ 438/162 |
| 5,804,473 A | 9/1998 | Takizawa | |
| 6,207,969 B1 * | 3/2001 | Yamazaki | ..................... 257/49 |
| 6,274,888 B1 | 8/2001 | Suzuki et al. | |
| 6,479,333 B1 * | 11/2002 | Takano et al. | ................ 438/159 |
| 6,501,095 B2 | 12/2002 | Yamaguchi et al. | |
| 6,746,901 B2 | 6/2004 | Kasahara et al. | |
| 6,963,173 B2 * | 11/2005 | Kawachi et al. | .......... 315/169.2 |
| 2001/0002325 A1 * | 5/2001 | Oda et al. | .................... 438/158 |
| 2002/0058365 A1 * | 5/2002 | Lee et al. | ..................... 438/166 |
| 2003/0228723 A1 * | 12/2003 | Yamazaki et al. | ........... 438/164 |
| 2004/0077132 A1 | 4/2004 | Lee | |
| 2004/0135205 A1 | 7/2004 | Jung | |
| 2004/0192013 A1 | 9/2004 | Ryu et al. | |

(Continued)

FOREIGN PATENT DOCUMENTS

JP    9-153458    6/1997

(Continued)

OTHER PUBLICATIONS

Abstract of Korean Patent Publication No. 2004-34270.

*Primary Examiner*—Lynne A Gurley
*Assistant Examiner*—Meiya Li
(74) *Attorney, Agent, or Firm*—Stein McEwen, LLP (57) ABSTRACT

A thin film transistor includes a semiconductor layer formed on a polycrystalline silicon layer crystallized by a super grain silicon (SGS) crystallization method. The thin film transistor is patterned such that the semiconductor layer does not include a seed or a grain boundary created when forming the semiconductor layer on the polycrystalline silicon layer.

9 Claims, 9 Drawing Sheets

U.S. PATENT DOCUMENTS

| | | | |
|---|---|---|---|
| 2005/0014315 A1* | 1/2005 | Yamamoto et al. | 438/166 |
| 2005/0158928 A1* | 7/2005 | So | 438/166 |
| 2005/0250308 A1* | 11/2005 | Yamaguchi et al. | 438/618 |
| 2006/0003503 A1* | 1/2006 | Yang et al. | 438/151 |

FOREIGN PATENT DOCUMENTS

| | | |
|---|---|---|
| JP | 2000-208771 | 7/2000 |
| JP | 2002-33330 | 1/2002 |
| JP | 2003-289040 | 10/2003 |
| JP | 2004-186206 | 7/2004 |
| JP | 2005-26330 | 1/2005 |
| KR | 2002-63093 | 8/2002 |
| KR | 2004-60502 | 7/2004 |
| KR | 2004-85310 | 10/2004 |

* cited by examiner

THIN FILM TRANSISTOR

CROSS-REFERENCE TO RELATED APPLICATION

This application claims priority to and the benefit of Korean Patent Application No. 2005-83326, filed Sep. 7, 2005, which is incorporated herein by reference in its entirety.

BACKGROUND OF THE INVENTION

1. Field of the Invention

Aspects of the present invention relate to a thin film transistor, and more particularly, to a thin film transistor including a semiconductor layer fabricated so as not to include, especially in a channel region, a seed or a grain boundary created in the crystallization of an amorphous silicon layer into a polycrystalline silicon layer by use of a super grain silicon (SGS) crystallization method.

2. Description of the Related Art

Recently, flat panel displays, such as, for example, liquid crystal display devices, organic electroluminescent devices and plasma display panels (PDPs), which overcome the disadvantages of heavy, large conventional display devices such as cathode ray tubes, have been receiving a lot of attention.

Among the elements that make up a flat panel display device, a thin film transistor has a notably significant effect on the properties of the device. In particular, the properties of the semiconductor layer in the thin film transistor directly affect the properties of the flat panel display.

The properties of the thin film transistor are dependent upon properties of the semiconductor layer, and generally, the properties of the semiconductor layer improve when its crystallinity improves.

In general, methods of crystallizing an amorphous silicon layer into a polycrystalline silicon layer include solid phase crystallization (SPC), excimer laser crystallization (ELC), metal induced crystallization (MIC), and metal induced lateral crystallization (MILC). SPC is a method of annealing an amorphous silicon layer for several hours at a temperature of 700° C. or less, at a transition temperature of glass. SPC is typically used to form the substrate of a display device that uses a thin film transistor. ELC is a method of crystallizing a silicon layer by irradiating it with an excimer laser and locally heating it to a high temperature for very short time. MIC is a method of using phase transfer induction to convert an amorphous silicon layer to polysilicon by contacting the amorphous silicon layer with a metal such as Ni, Pd, Au and Al or by implanting such a metal into the amorphous silicon layer. MILC is a technique of inducing sequential crystallization of silicon by lateral diffusion of silicide formed by reacting metal with the silicon.

However, SPC not only takes a long time, but also produces an inferior crystal. ELC requires an expensive apparatus, and MIC and MILC result in a large leakage current due to catalysts remaining in the silicon.

SUMMARY OF THE INVENTION

Aspects of the present invention provide a thin film transistor including a semiconductor layer formed on a polycrystalline silicon layer crystallized by a super grain silicon (SGS) crystallization method, wherein a seed or a grain boundary created by the SGS method is not located within the semiconductor layer.

According to an aspect of the present invention, a thin film transistor, includes: a substrate; a semiconductor layer disposed on the substrate and including at least one channel region; and a gate electrode insulated from the semiconductor layer, wherein the semiconductor layer is formed of silicon crystallized radially out from one point and wherein the one point from which the silicon was crystallized is partially surrounded by the channel region.

According to another aspect of the present invention, a method of forming a thin film transistor comprising a substrate, a semiconductor layer disposed on the substrate and including at least one channel region, and a gate electrode insulated from the semiconductor layer, comprises: forming an amorphous silicon layer, a capping layer and a metal catalyst layer on the substrate; providing a first heat treatment such that metal catalyst from the metal catalyst layer diffuses into the amorphous silicon layer; removing the metal catalyst layer or both the metal catalyst layer and the capping layer; providing a second heat treatment such that the metal catalyst that has diffused into the amorphous silicon layer forms one or more seeds, and wherein the amorphous silicon of the amorphous silicon layer crystallizes radially outward from each of the one or more seeds to form a polycrystalline silicon layer having a plurality of grains, each grain having one seed, which centrally located in the grain, and the polycrystalline silicon layer having grain boundaries between adjacent grains; forming a patterned layer on a grain of the polycrystalline silicon layer, wherein the patterned layer partially surrounds the seed, wherein the patterned layer does not include the seed and does not cross a grain boundary and wherein the patterned layer corresponds to the at least one channel region of the semiconductor layer; forming the semiconductor layer on the grain of the polycrystalline layer using the patterned layer as a mask; and forming the gate electrode.

According to another aspect of the present invention, a method of forming a thin film transistor comprising a substrate, a semiconductor layer disposed on the substrate and including at least one channel region, and a gate electrode insulated from the semiconductor layer, comprises: forming an amorphous silicon layer and a barrier layer on the amorphous layer, wherein the barrier layer is patterned to leave at least one predetermined region of the amorphous silicon layer exposed; forming a capping layer and a metal catalyst layer on the barrier layer and the at least one predetermined region of the amorphous silicon layer; providing a first heat treatment such that metal catalyst from the metal catalyst layer diffuses into the at least one predetermined region of the amorphous silicon layer; removing the metal catalyst layer or both the metal catalyst layer and the capping layer; providing a second heat treatment such that the metal catalyst that has diffused into the at least one predetermined region of the amorphous silicon layer forms a seed in the at least one predetermined region, and wherein the amorphous silicon of the amorphous silicon layer crystallizes radially outward from the seed to form a crystalline silicon layer comprising a grain, wherein the grain is surrounded by a region of uncrystallized silicon or by one or more grain boundaries; forming a patterned layer on the grain of the crystalline silicon layer, wherein the patterned layer partially surrounds the seed, wherein the patterned layer does not include the seed or any region of uncrystallized silicon and does not cross a grain boundary and wherein the patterned layer corresponds to the at least one channel region of the semiconductor layer; forming the semiconductor layer on the grain of the crystalline layer using the patterned layer as a mask; and forming the gate electrode.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Embodiment 1

Figure 1:
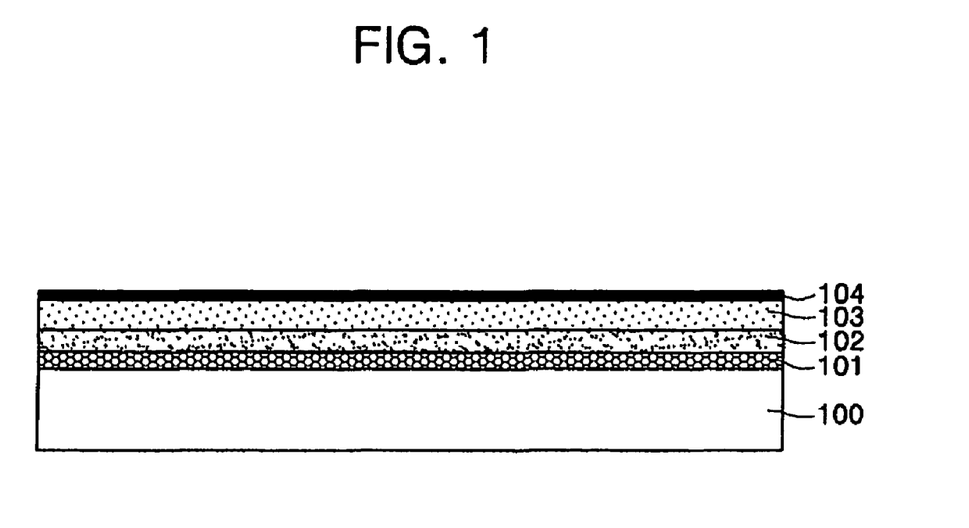
FIGS. 1, 2 and 3A are cross-sectional views showing a method of crystallizing an amorphous silicon layer into a polycrystalline silicon layer by a super grain silicon (SGS) crystallization method according to a first embodiment of the invention.
Figure 2:
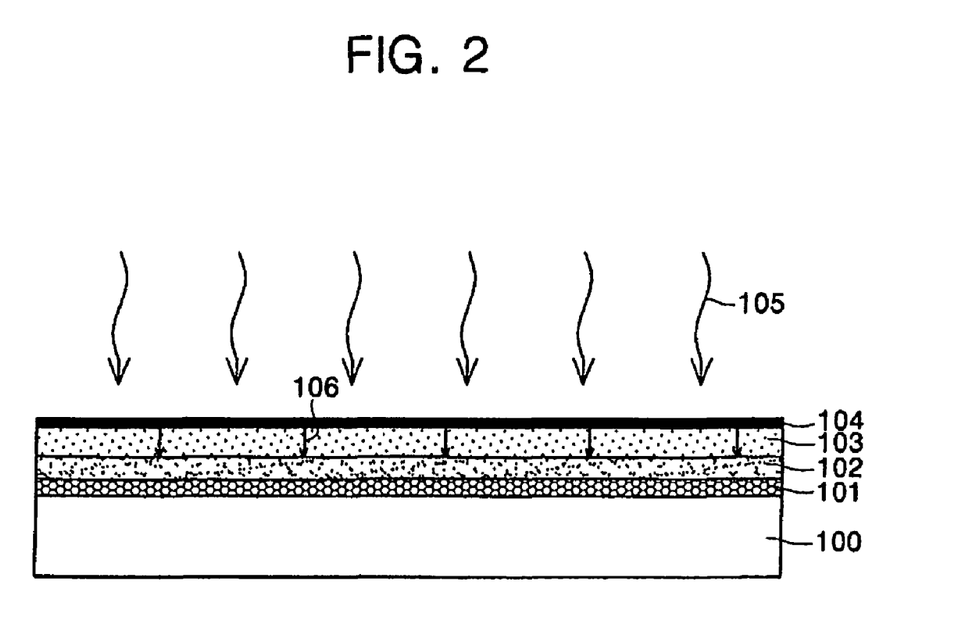
Figure 3A:
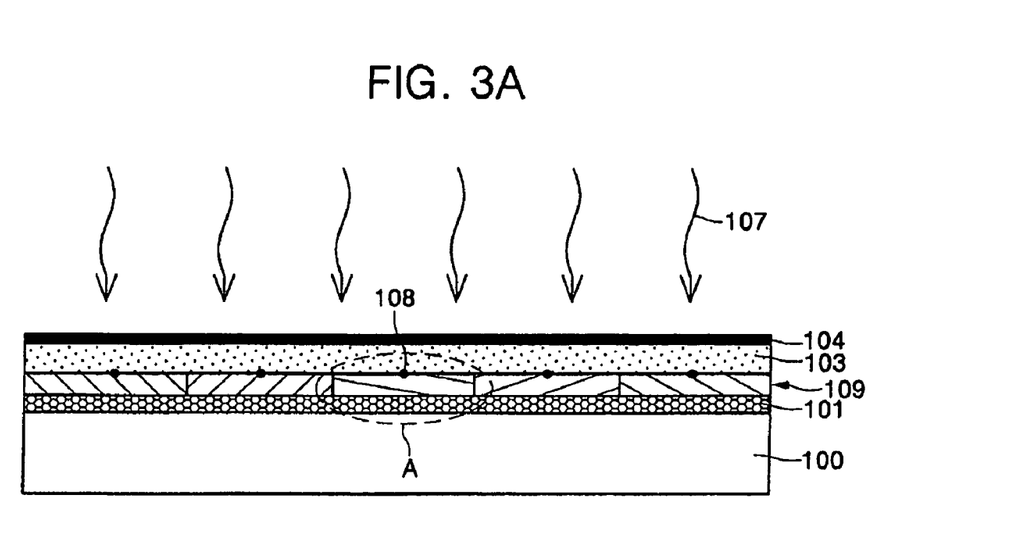
Figure 3B:
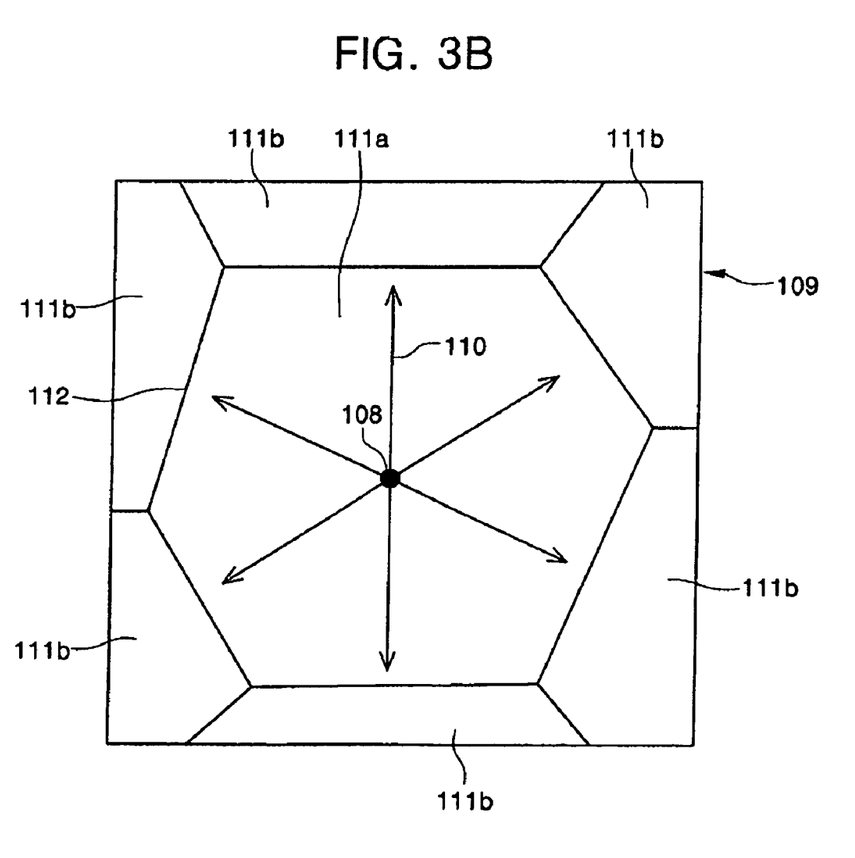
FIG. 3B is a magnified plan view of a region A in FIG. 3A.

FIGS. 1, 2 and 3A are cross-sectional views showing a method of crystallizing an amorphous silicon layer into a polycrystalline silicon layer by a super grain silicon crystallization method according to a first embodiment of the invention, and FIG. 3B is a magnified plan view of a region A shown in FIG. 3A.

Referring to FIG. 1, a buffer layer 101 is formed of, for example, silicon oxide, silicon nitride, or a combination thereof by physical vapor deposition (PVC) or chemical vapor deposition (CVD) on a transparent insulating substrate 100 formed of, for example, glass or plastic.

The buffer layer 101 serves to prevent moisture or impurities generated on the substrate from diffusing into an element to be formed later and to regulate the heat transmission rate during crystallization, thereby enabling a semiconductor layer to be smoothly crystallized.

Next, an amorphous silicon layer 102 is formed on the buffer layer 101 by physical vapor deposition (PVD) or chemical vapor deposition (CVD).

Next, a capping layer 103, which can be made of an insulating material such as, for example, an oxide or a nitride, is formed on the amorphous silicon layer 102.

Next, a metal catalyst layer 104 is formed on the capping layer 103.

As a non-limiting example, the metal catalyst layer 104 may be formed of at least one of Ni, Pd, Ti, Ag, Au, Al, Sn, Sb, Cu, Co, Mo, Cr, Ru, Rh, Cd and Pt.

As a non-limiting example, the metal catalyst can be Ni, and the capping layer 103 can be formed of a silicon nitride layer. This is because when the amorphous silicon layer is crystallized by Ni to form a polycrystalline silicon layer, the polycrystalline silicon layer has the best properties. Further, the silicon nitride capping layer has excellent diffusion properties for Ni during the first heat treatment process, described below.

Referring to FIG. 2, the substrate 100 including the buffer layer 101, the amorphous silicon layer 102, the capping layer 103 and the metal catalyst layer 104 is heat-treated by a first heat treatment process, as represented by the arrows 105.

During the first heat treatment process, the metal catalyst in the metal catalyst layer 104 diffuses through the capping layer 103 into the amorphous silicon layer 102, as represented by the arrows 106.

Referring to FIG. 3A, after the first heat treatment process is completed and a predetermined metal catalyst reaches the amorphous silicon layer 102 through the capping layer 103, the substrate 100 is heat-treated by a second heat treatment process, represented by arrows 107.

When the second heat treatment process starts, seeds 108 are created in a predetermined region of the amorphous silicon layer 102, and then the amorphous silicon layer 102 crystallizes into a polycrystalline silicon layer 109 by growth of the seeds 108.

The metal catalyst layer 104, or both the metal catalyst layer 104 and the capping layer 103, may be removed before the second heat treatment process 107 begins.

The number and density of the seeds 108 that form depend on the amount and/or density of the metal catalyst that diffuses from the metal catalyst layer 104 into the amorphous silicon layer 102. Thus, the conditions of the first heat treatment process 105, the thickness of the capping layer 103 and the thickness of the metal catalyst layer 104 may be controlled to control the amount and density of the metal catalyst in the amorphous silicon layer 102 and thereby control the number and density of the seeds 108 created by the second heat treatment process.

Referring to FIG. 3B, the amorphous silicon layer 102 is gradually crystallized by crystals that grow radially from the seeds 108 created by the second heat treatment process.

That is, as shown in FIG. 3B, crystallinity spreads radially from each one of the seeds 108. Put another way, grains, such as grain 111a, grow gradually in the radial direction, represented by arrows 110, and the growth goes on until another grain 111b is contacted or until the second heat treatment process is completed. An interface of the grain 111a with the other grain 111b becomes a grain boundary 112.

The greater the distance between the seeds 108, the greater the size of the grain 111a that can be produced. The distance between the seeds 108 can be controlled according to the amount and density of the diffused metal catalyst, as described with reference to FIG. 3A.

Typically, the grains 111a and 111b grow radially so as to have the shape of a circle or regular polygon.

Figure 4A:
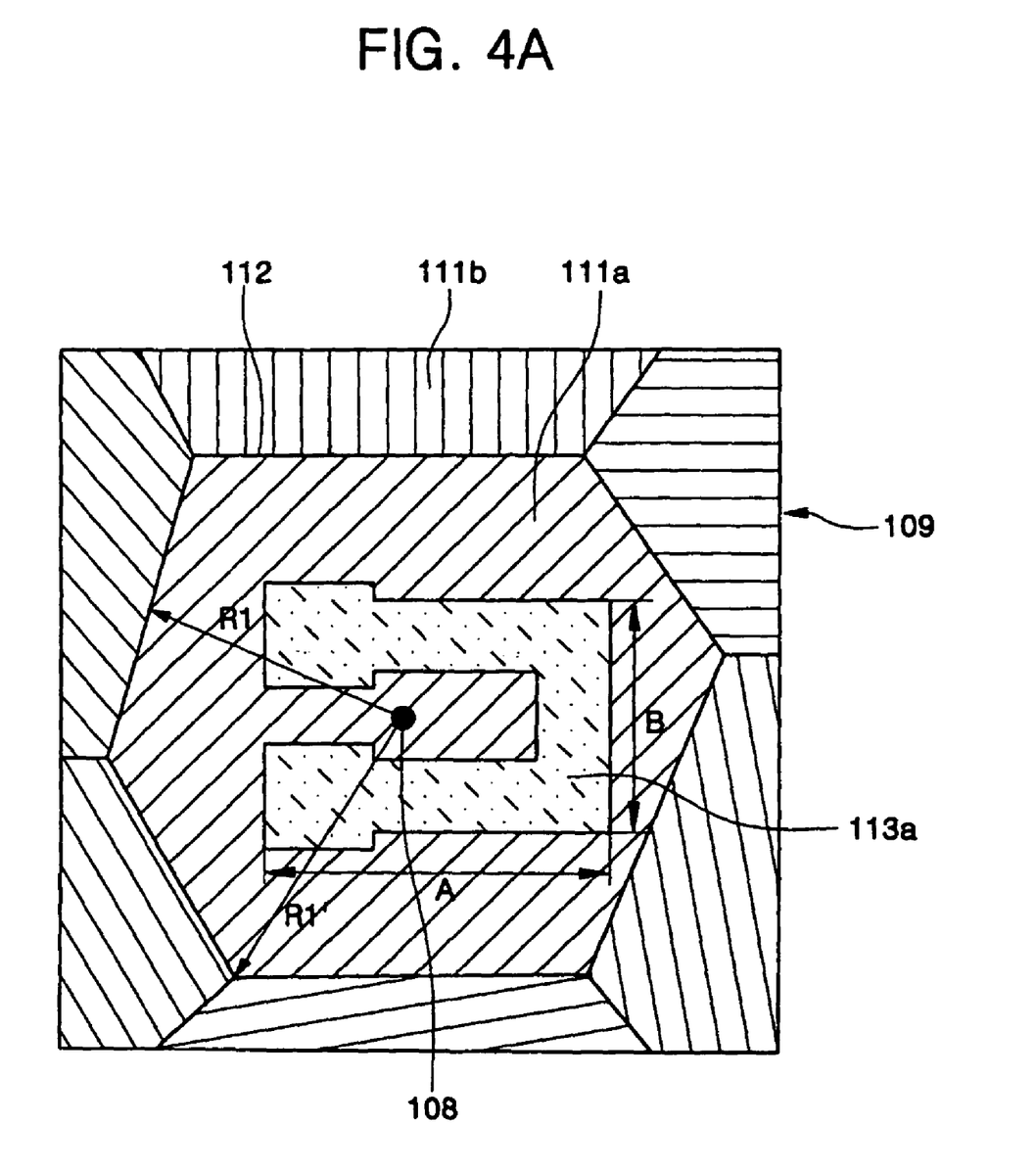
FIGS. 4A to 4C are plan views showing various alternative patterns for forming a semiconductor layer having two or more channels on an polycrystalline silicon layer following crystallization of an amorphous silicon layer into a polycrystalline silicon layer by the SGS crystallization method.
Figure 4B:
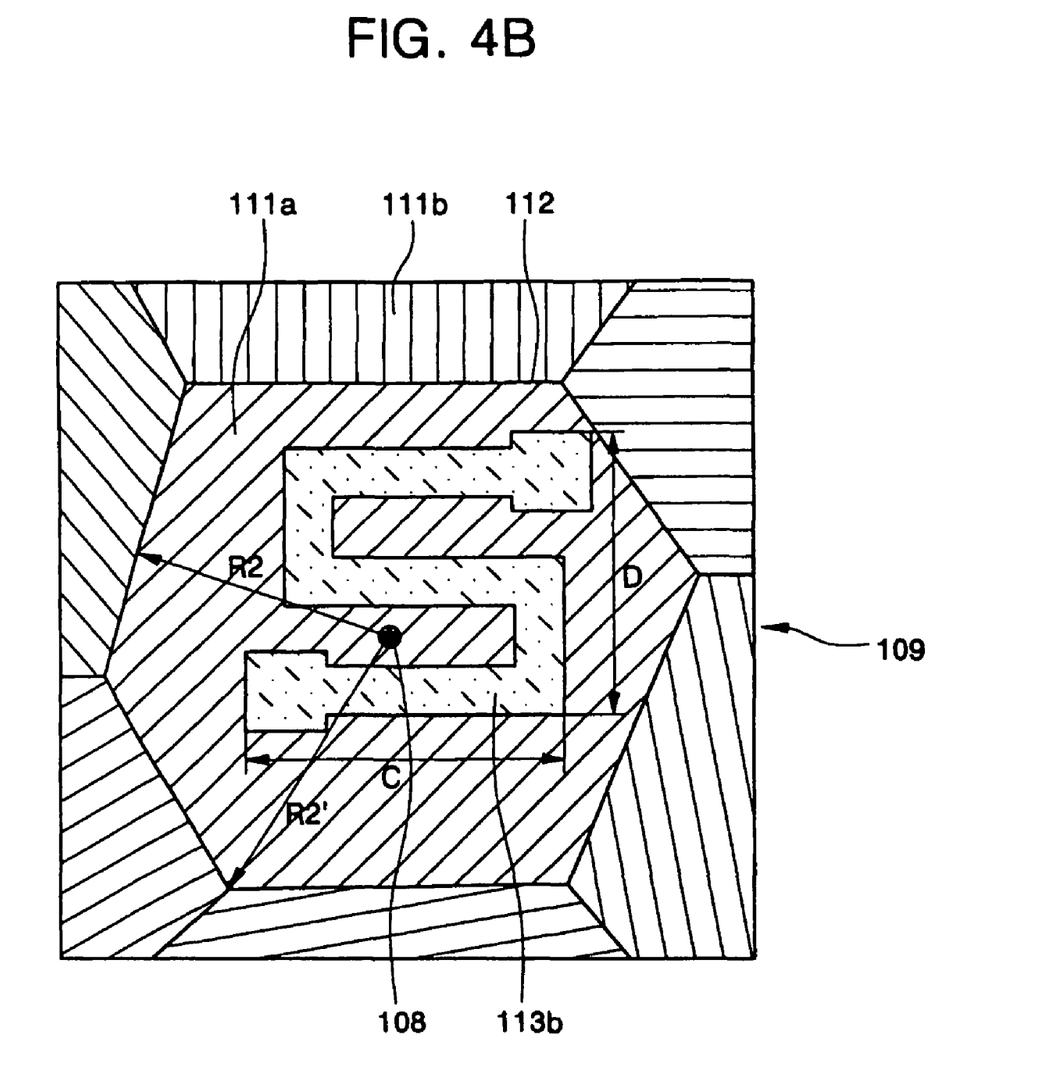
Figure 4C:
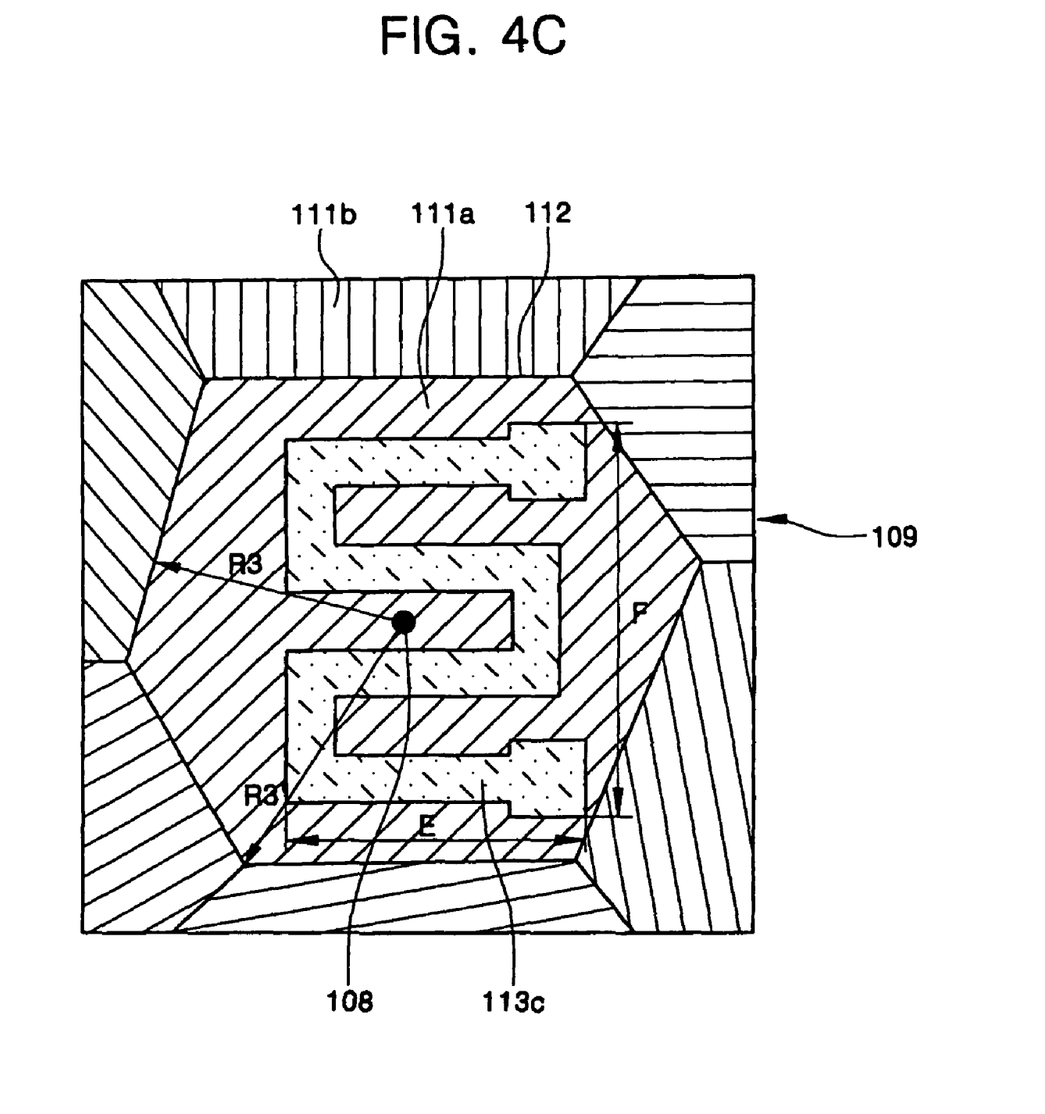

FIGS. 4A to 4C are plan views showing alternative patterns for forming a semiconductor layer having two or more channels on an polycrystalline silicon layer following crystallization of an amorphous silicon layer into the polycrystalline silicon layer by an SGS crystallization method.

Hereinafter, the semiconductor layer refers to a channel region at least and, if necessary, includes source and drain regions.

Referring to FIG. 4A, after crystallizing the amorphous silicon layer 102 into the polycrystalline silicon layer 109 by the second heat treatment process in the SGS crystallization method, a first pattern 113a, which will serve as a mask to form a semiconductor layer having two channels, is formed on a grain 111a of the polycrystalline silicon layer 109 to partially surround the seed 108, which remains as one point on the grain 111a of the polycrystalline silicon layer. The first pattern 113a is formed to partially surround the seed 108. That is, the first pattern 113a is open on one side, so that the seed 108 is not completely surrounded. The reason for forming the first pattern 113a (an A×B region, i.e., a semiconductor layer region) surrounding or partially surrounding the seed 108 is that the seed 108 represents the approximate center of the grain 111a crystallized by the SGS method. Thus, using the location of the seed 108 as a guide, the first pattern 113a, and the semiconductor region formed using the first pattern 113a as a mask, can be formed such that the grain boundary 112, which is on the perimeter of the grain 111a, is not crossed. A semiconductor layer, especially a channel region, can be formed that does not include a grain boundary. As a result, the semiconductor layer has excellent properties.

In order to include the entire first pattern 113a region in one grain 111a, the longer of sides A and B defining the first pattern 113a region should be longer than the shortest diameter (that is, a length of 2×R1) of the grain 111a and shorter than the longest diameter (that is, a length of 2×R1') of the grain 111a.

In other words, creating the first pattern 113a region surrounding the seed 108 enables the semiconductor layer free of the grain boundary to be made as large as possible, for a given grain size. In other words, when the semiconductor layer not having the grain boundary is formed to a given size, locating the first pattern 113a so that it surrounds the seed 108 makes it possible to use the smallest grain size. Thus, less effort is required to enlarge the grain in the process.

Alternatively, referring to FIGS. 4B and 4C, after the amorphous silicon layer 102 has crystallized into the polycrystalline silicon layer 109 by the second heat treatment process, a second pattern 113b as shown in FIG. 4B or a third pattern 113c as shown in FIG. 4C may be disposed to form a semiconductor layer having three channels or four channels, respectively, on the polycrystalline silicon layer 109.

Here, the second pattern 113b or the third pattern 113c is formed around the seed 108 in the center of the grain 111a so as not to include the seed 108 and the grain boundary 112 in the pattern, similar to the first pattern 113a described with reference to FIG. 4A, Here, like the first pattern 113a, the longer of sides C and D defining the second pattern 113b region should be longer than the shortest diameter of the grains (that is, a length of 2×R2) and shorter than the longest diameter of the grains (that is, a length of 2×R2'). Similarly, the longer of sides E and F defining the third pattern 113c region should be longer than the shortest diameter of the grains (that is, a length of 2×R3) and shorter than the longest diameter of the grains (that is, a length of 2×R3').

Generally, a semiconductor layer having two or more channels has excellent electrical characteristics due to less leakage current.

Figure 5:
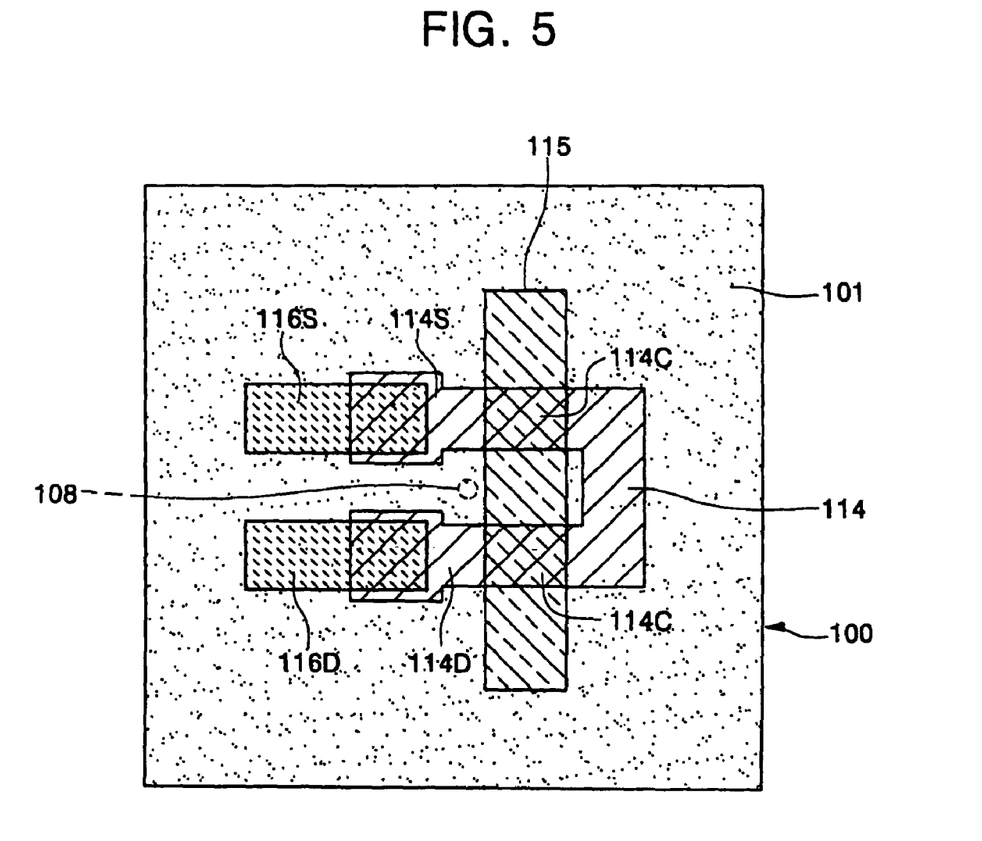
FIG. 5 is a plan view showing a process of fabricating a thin film transistor including a semiconductor layer according to the first embodiment of the invention.

FIG. 5 is a plan view showing a process of fabricating a thin film transistor including a semiconductor layer on the patterned polycrystalline silicon layer 109 according to FIG. 4A.

Referring to FIG. 5, a semiconductor layer 114 is formed by etching the polycrystalline silicon layer 109 using the first pattern 113a as an etch mask.

Since the polycrystalline silicon layer 109 is etched, the surrounding grains (111b in FIG. 4A) and the grain boundary (112 in FIG. 4A) of the polycrystalline silicon layer do not appear in FIG. 5. However, it is to be understood that the semiconductor layer 114 of FIG. 5 is formed in the region defined by the first pattern 113a of FIG. 4A, i.e., the same region as the rectangular region of A×B in FIG. 4A. Referring to FIG. 4A, the semiconductor layer 114 of FIG. 5 is formed within the bounds of one grain 111a and does not include a seed 108 or a grain boundary 112. More generally, at least the channel region of the semiconductor layer should be formed of only one grain and should not include a seed or grain boundary.

In addition, a gate insulating layer (not shown) covering the semiconductor layer 114 is disposed on the substrate, and a gate electrode 115 is formed on the gate insulating layer. In the embodiment of FIG. 5, two channels 114c are formed in the semiconductor layer 114.

Source and drain regions 114S and 114D can be formed by implanting impurities into the semiconductor layer 114 using the gate electrode 115 as a mask.

Subsequently, an interlayer insulating layer (not shown) is formed on the substrate, and the source and drain regions 114S and 114D of the semiconductor layer are exposed by etching the interlayer insulating layer and a prescribed region of the gate insulating layer.

Subsequently, a material for forming source and drain electrodes is deposited on the substrate and then patterned to form source and drain electrodes 116S and 116D, thereby manufacturing a thin film transistor.

While FIG. 5 illustrates a thin film transistor having a two-channel semiconductor layer formed using the first pattern 113a of FIG. 4A, a thin film transistor having the three- or four-channel semiconductor layer may be formed using the second pattern 113b or the third pattern 113c of FIGS. 4B or 4C, respectively in a similar manner as described with reference to FIG. 5.

Embodiment 2

Figure 6A:
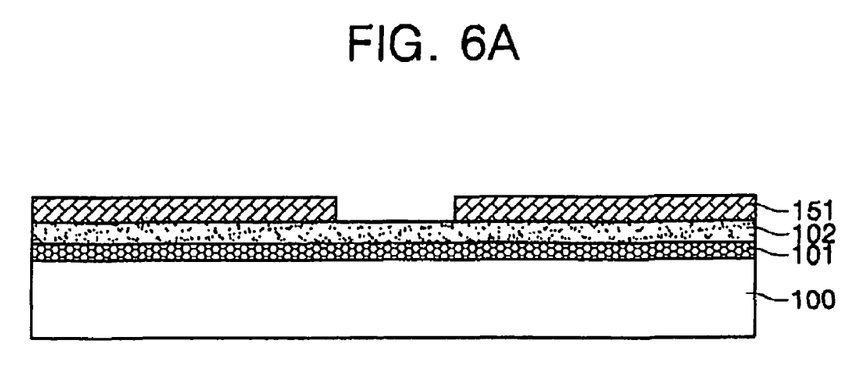
FIGS. 6A, 7, and 8A are cross-sectional views showing a method of crystallizing an amorphous silicon layer into a polycrystalline silicon layer by a SGS crystallization method according to a second embodiment of the invention.
Figure 6B:
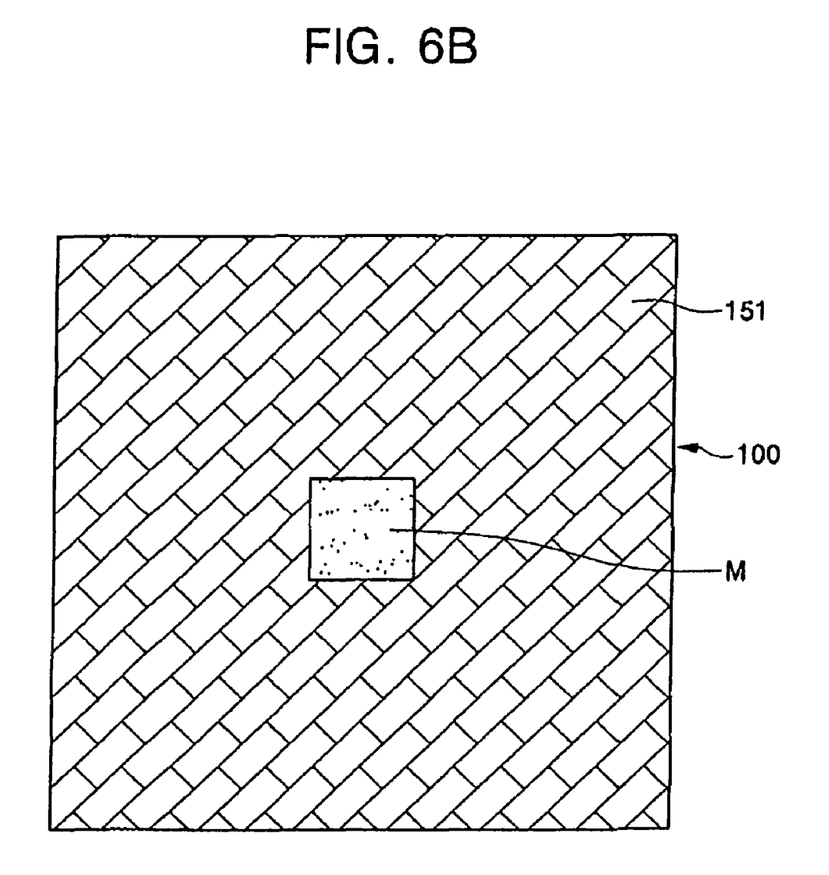
FIG. 6B is a plan view of the structure shown in FIG. 6A.
Figure 7:
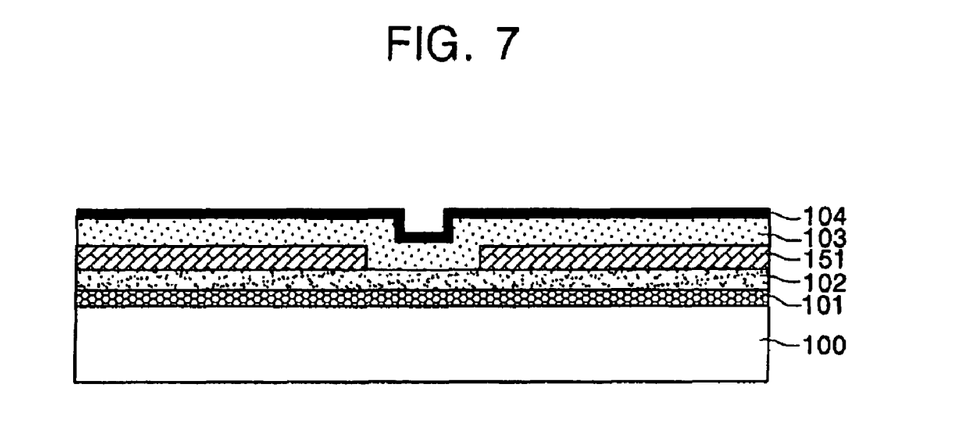
Figure 8A:
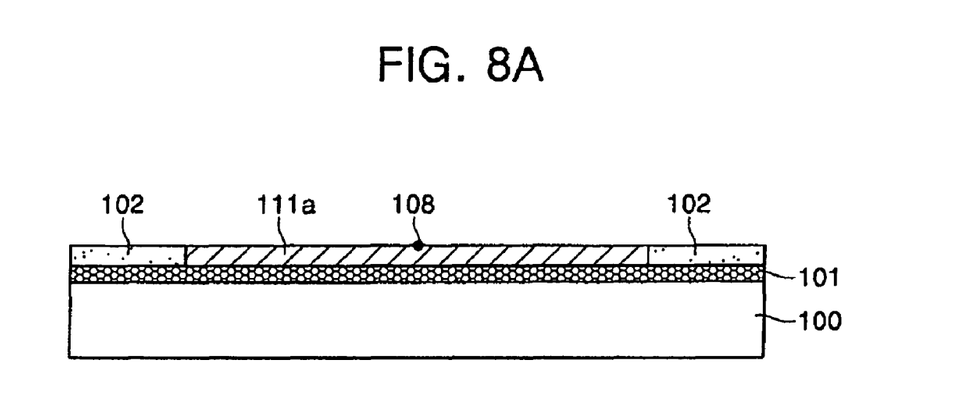
Figure 8B:
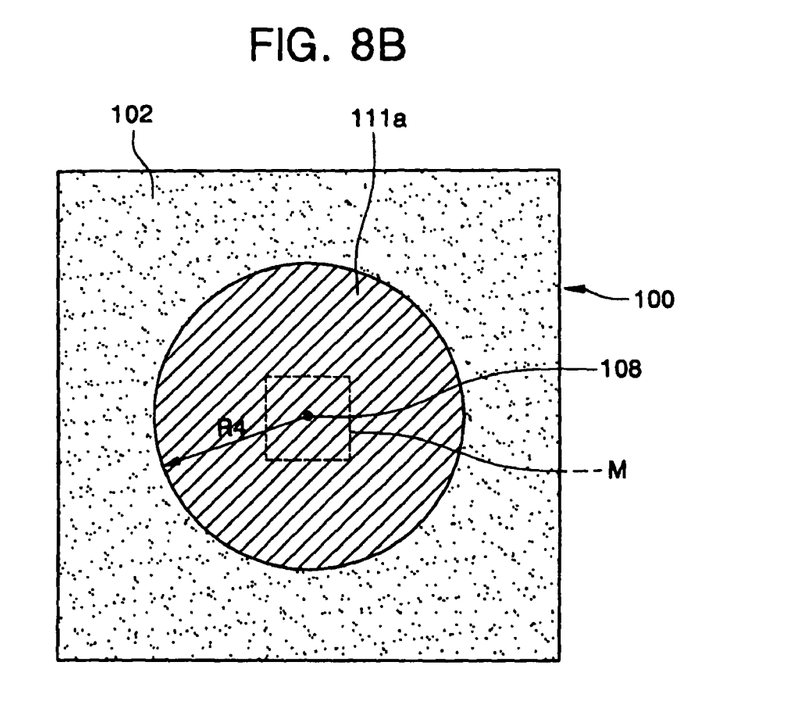
FIG. 8B is a plan view of the structure shown in FIG. 8A.

FIGS. 6A, 7, and 8A are cross-sectional views showing a method of crystallizing an amorphous silicon layer into a polycrystalline silicon layer by an SGS crystallization method according to a second embodiment of the invention. FIG. 6B is a plan view of the structure shown in FIG. 6A, and FIG. 8B is a plan view of the structure shown in FIG. 8A.

Referring to FIGS. 6A and 6B, a buffer layer 101 is disposed on a transparent insulating substrate, such as, for example, a substrate formed of glass or plastic. An amorphous silicon layer 102 is formed on the buffer layer 101, and a barrier pattern 151 is formed to open a predetermined region of the amorphous silicon layer 102 thereon.

As shown in FIG. 6B, the barrier pattern 151 exposes a predetermined area M of the amorphous silicon layer that is under the barrier pattern 151. As shown in FIG. 6B, the barrier pattern 151 is formed to expose the amorphous layer in the shape of a rectangle, but it may also be formed in another shape, for example, in the shape of a circle or a pentagon. However, the exposed area should be limited because it is not desirable for the exposed area to get too wide, such that two or more seeds are included on the surface of the exposed amorphous silicon layer 102. Thus, the barrier pattern 151 is formed to expose an appropriate area of the amorphous silicon layer 102.

Referring to FIG. 7, a capping layer 103 is formed on the substrate having the barrier pattern 151. Subsequently, a metal catalyst layer 104 is formed on the capping layer 103.

Then, with the same methods described with reference to FIGS. 2, 3A and 3B of Embodiment 1, the substrate 100 is heat-treated by first and second heat treatment processes, thereby crystallizing the amorphous silicon layer 102.

Embodiment 2 differs from Embodiment 1 in the existence of the barrier pattern 151, which serves to inhibit the metal catalyst from diffusing into the amorphous silicon layer 102. The metal catalyst cannot diffuse into regions of the amorphous silicon layer 102 where the barrier pattern 151 is formed, and therefore, seeds are not created in these regions. However, the metal catalyst can diffuse into the exposed region of the predetermined area M, so that crystallization can progress with respect to the exposed region M.

Referring to FIGS. 8A and 8B, a seed 108 is created by the diffusion of the metal catalyst into the region M that is not covered by the barrier pattern 151, and crystallization progresses from the seed 108 radially so that a single grain 111a is formed.

At the conclusion of the crystallization, an amorphous silicon layer 102 that is not crystallized exists around the grain 111a. This region is not crystallized because a seed was not present in the region. Also, since this region is not used to form a semiconductor layer, it is not necessary to form a seed and crystallize it. It is to be understood that the barrier pattern can be formed on a layer of amorphous silicon with more than one exposed region, so that more than one crystallized region can be formed.

In the method according to embodiment 1, it was difficult to form a seed in a specific, desirable region because of lack of control of the placement of seeds. In the method according to embodiment 2, the barrier pattern 151 is formed as above, thereby allowing the seed 108 to be formed in a specific, desired place and allowing the distance between the seeds 108 to be controlled as desired. Thus, sufficient space is obtained to enable crystallization of the grain 111a to a desired size.

Figure 9:
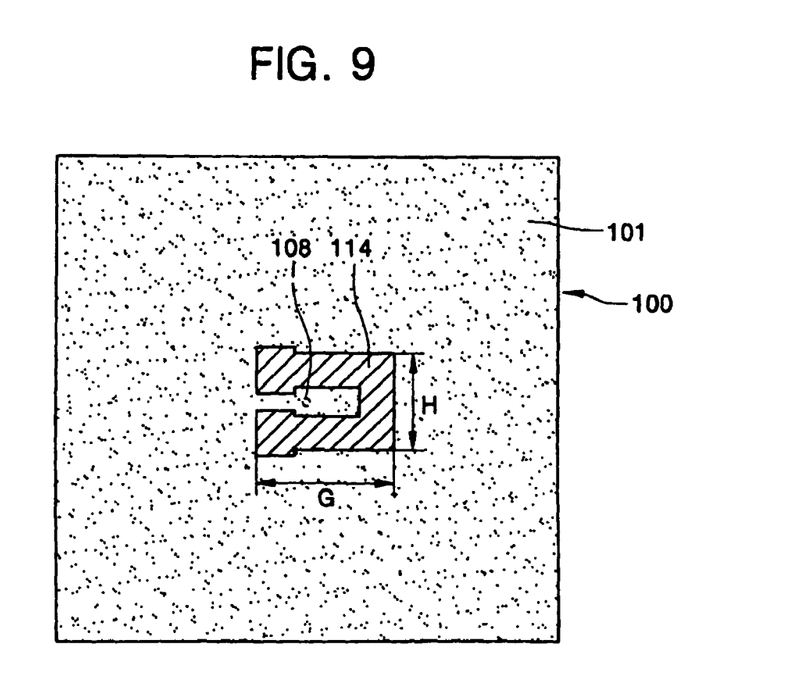
FIG. 9 is a plan view showing a process of forming a semiconductor layer by patterning crystallized crystal grains according to the second embodiment of the invention.

FIG. 9 is a plan view of a process of forming a semiconductor layer by patterning a grain crystallized according to the second embodiment of the invention.

Referring to FIG. 9, a semiconductor layer 114 is formed by patterning the grain 111a of FIG. 8B and then etching the crystalline silicon using the pattern as a mask.

Just as described with reference to FIGS. 4A to 4C of Embodiment 1, the semiconductor layer 114 is formed to surround the seed 108 and to be open on one side.

Further, to ensure that the semiconductor layer 114 lies with a single grain, the length of the longest side of the semiconductor layer 114 region (the G×H region of FIG. 9) should be shorter than the diameter (twice of R4) of the grain 111a shown in FIG. 8B.

Next, as described with reference to FIG. 5 of embodiment 1, a thin film transistor is completed by forming a gate insulating layer, a gate electrode, an interlayer insulating layer and source and drains electrodes.

Consequently, a thin film transistor of the invention does not include an element that would inhibit the characteristics of the thin film transistor, such as, for example, a seed or a grain boundary, but includes at least two channels in a semiconductor layer, thereby providing a thin film transistor having excellent electrical characteristics such as leakage current.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
a substrate;
a patterned semiconductor layer disposed on the substrate and including at least two channel regions, a single source region and a single drain region; and
a gate electrode insulated from the semiconductor layer,
wherein the patterned semiconductor layer of the thin film transistor is disposed entirely within a single grain of silicon that was crystallized radially outwards from only a single point such that the single grain of silicon is surrounded by polycrystalline silicon, and wherein the patterned semiconductor layer partially surrounds an area where the single point had been.

2. The thin film transistor according to claim 1, wherein the semiconductor layer is formed of silicon crystallized by a super grain silicon (SGS) crystallization method.

3. The thin film transistor according to claim 2, wherein the SGS crystallization method includes forming an amorphous silicon layer, a capping layer and a metal catalyst layer on the substrate to provide a resulting structure that is the formed amorphous silicon layer, the capping layer and the metal catalyst layer on the substrate, and crystallizing the amorphous silicon layer into a polycrystalline silicon layer by heat-treating the resultant structure.

4. The thin film transistor according to claim 3, wherein the capping layer is formed of a silicon nitride layer.

5. The thin film transistor according to claim 3, wherein the metal catalyst layer is formed of at least one of Ni, Pd, Ti, Ag, Au, Al, Sn, Sb, Cu, Co, Mo, Cr, Ru, Rh, Cd and Pt.

6. The thin film transistor according to claim 1, wherein the single point is a seed created by an SGS crystallization method.

7. A thin film transistor, comprising:
a substrate;
a patterned semiconductor layer disposed on the substrate and including at least two channel regions, a single source region and a single drain region; and
a gate electrode insulated from the semiconductor layer,
wherein the patterned semiconductor layer of the thin film transistor is located entirely within a single grain of silicon, wherein the single grain of silicon is surrounded by polycrystalline silicon, and wherein the patterned semiconductor layer includes a u-shaped portion that is open on one side.

8. The thin film transistor of claim 7, wherein the u-shaped portion partially surrounds a central area of the single grain of silicon from which the patterned semiconductor layer was formed.

9. An intermediate structure in the fabrication of a thin film transistor, comprising:
a substrate;
a polycrystalline silicon layer having one or more grains, each grain having a single seed created by an SGS crystallization method, wherein the single seed is centrally located in the grain, and wherein the polycrystalline silicon layer has grain boundaries between adjacent grains; and
a mask layer disposed on the polycrystalline silicon layer, wherein the mask layer defines a pattern in the polycrystalline silicon layer for a semiconductor layer having two channels, wherein the mask layer is formed entirely within one grain of the polycrystalline silicon layer and wherein the mask layer partially surrounds the single seed.

* * * * *